United States Patent
Loung et al.

(10) Patent No.: US 9,328,943 B2
(45) Date of Patent: May 3, 2016

(54) IDCA FOR FAST COOLDOWN AND EXTENDED OPERATING TIME

(75) Inventors: Vincent Loung, Lompoc, CA (US);
Elna Saito, Santa Barbara, CA (US);
Jeff W. Scott, Santa Barbara, CA (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days.

(21) Appl. No.: 13/822,522

(22) PCT Filed: Jul. 20, 2012

(86) PCT No.: PCT/US2012/047688
§ 371 (c)(1),
(2), (4) Date: Mar. 12, 2013

(87) PCT Pub. No.: WO2013/016224
PCT Pub. Date: Jan. 31, 2013

(65) Prior Publication Data
US 2013/0192275 A1    Aug. 1, 2013

Related U.S. Application Data

(60) Provisional application No. 61/510,903, filed on Jul. 22, 2011, provisional application No. 61/530,312, filed on Sep. 1, 2011.

(51) Int. Cl.
| | | |
|---|---|---|
| *F25B 9/02* | (2006.01) | |
| *F25B 39/02* | (2006.01) | |
| *H05K 7/20* | (2006.01) | |
| *F25B 19/02* | (2006.01) | |

(52) U.S. Cl.
CPC . *F25B 9/02* (2013.01); *F25B 19/02* (2013.01); *F25B 39/02* (2013.01); *H05K 7/20254* (2013.01); *H05K 7/20354* (2013.01); *H05K 7/20372* (2013.01); *F25B 2339/02* (2013.01)

(58) Field of Classification Search
CPC .............. F25B 9/02; F25B 5/02; F25B 39/02; F25B 2339/02; F25B 25/00; F25B 25/005; F25B 25/02; F25B 7/00; F17C 2227/0325; F17C 2227/036; H05K 7/20354; H05K 7/20372; H05K 7/20254

USPC ........... 62/6, 51.1, 51.2, 259.2; 165/164, 166, 165/175, 80.4, 168, 171
See application file for complete search history.

(56) References Cited

U.S. PATENT DOCUMENTS

| | | | | |
|---|---|---|---|---|
| 4,386,505 A | * | 6/1983 | Little | .......................... 62/51.1 |
| 4,392,362 A | * | 7/1983 | Little | ............... B21D 53/045 |
| | | | | 165/168 |

(Continued)

FOREIGN PATENT DOCUMENTS

EP          0 916 890 A2    5/1999

OTHER PUBLICATIONS

Pope, Alan W., and Walter E. Miller. Development of a Two-Stage Alternate Joule-Thomson Cryo-Cooler for AAWS-M Risk Reduction. No. AMSMI-TR-RD-AS-91-22. Army Missile Command Redstone Arsenal AL Advanced Sensors Directorate, 1991.*

(Continued)

*Primary Examiner* — Frantz Jules
*Assistant Examiner* — Brian King
(74) *Attorney, Agent, or Firm* — Terry M. Sanks, Esq.; Beusse Wolter Sanks & Maire, PLLC

(57) ABSTRACT

Systems, methods, and devices for integrated detector cooler assemblies (IDCAs) and multi-circuit cryostats are discussed herein. Solutions include using cryostats with multiple cooling circuits. Some cryostat variations may include a rapid cooldown circuit and a temperature maintenance circuit. In some cases, the temperature maintenance circuit may be a closed-loop circuit run by a compressor instead of an open-loop circuit run on a pressurized gas bottle/cartridge. Variations of a cryostat may also include a gas expander portion that replaces the coldfinger of typical IDCAs. Further variations of cooling circuits may include circuits that perform reverse-flow heat exchange to pre-cool incoming refrigerant and also cooling circuits that have heat bridges disposed thereon to assist in such heat exchange.

22 Claims, 12 Drawing Sheets

(56) References Cited

U.S. PATENT DOCUMENTS

| | | | | |
|---|---|---|---|---|
| 4,489,570 | A | * | 12/1984 | Little .......................... 62/51.1 |
| 5,239,200 | A | * | 8/1993 | Messina et al. ............... 257/714 |
| 5,611,214 | A | * | 3/1997 | Wegeng et al. ................ 62/498 |
| 5,896,922 | A | * | 4/1999 | Chrysler ............... F25B 39/024 165/146 |
| 5,974,808 | A | | 11/1999 | Mangano et al. |
| 6,213,194 | B1 | * | 4/2001 | Chrysler ............... F25B 39/024 165/80.3 |
| 6,463,744 | B1 | | 10/2002 | Alexeev et al. |
| 7,397,661 | B2 | * | 7/2008 | Campbell .......... H05K 7/20754 165/104.33 |
| 8,141,556 | B2 | * | 3/2012 | Ruben .......................... 128/897 |
| 2007/0209371 | A1 | * | 9/2007 | Sobel .................... C09K 5/041 62/51.2 |
| 2007/0245749 | A1 | | 10/2007 | Atkins et al. |
| 2009/0193817 | A1 | * | 8/2009 | Germain et al. ............... 62/51.1 |
| 2010/0283854 | A1 | | 11/2010 | McKaughan et al. |

OTHER PUBLICATIONS

Little, W. A., et al. "Microminiature refrigeration." AIP Conference Proceedings. vol. 985. No. 1. 2008.*

Narayanan, S. Pradeep, and G. Venkatarathnam. "Analysis of performance of heat exchangers used in practical micro miniature refrigerators." Cryogenics 39.6 (1999): 517-527.*

Lerou, P. P. P. M., et al. "All-micromachined Joule-Thomson cold stage." (2007): 437-441.*

Little, W. A., and I. Sapozhnikov. "Development of a low cost, cryogenic refrigeration system for cooling of cryoelectronics." Advances in cryogenic engineering. Springer US, 1994. 1467-1474.*

Chorowski, M., E. Bodio, and M. Wilczek. "Development and testing of a miniature Joule-Thomson refrigerator with sintered powder heat exchanger." Advances in cryogenic engineering. Springer US, 1994. 1475-1481.*

Lyon, K. G., et al. "Linear thermal expansion measurements on silicon from 6 to 340 K." Journal of Applied Physics 48.3 (1977): 865-868.*

McConnell, Angela D., Srinivasan Uma, and Kenneth E. Goodson. "Thermal conductivity of doped polysilicon layers." Microelectromechanical Systems, Journal of 10.3 (2001): 360-369.*

Baine PT, Uppal S., Armstrong GA, Mitchell SJN and Gamble HS. "Thermal vias for SOI technology", Proc ICCCD International Conference on Communications, Computers and Devices, Kharagpur, India, 2000, p. 239-242.*

Supplementary European Search Report, Jan. 8, 2015.

* cited by examiner

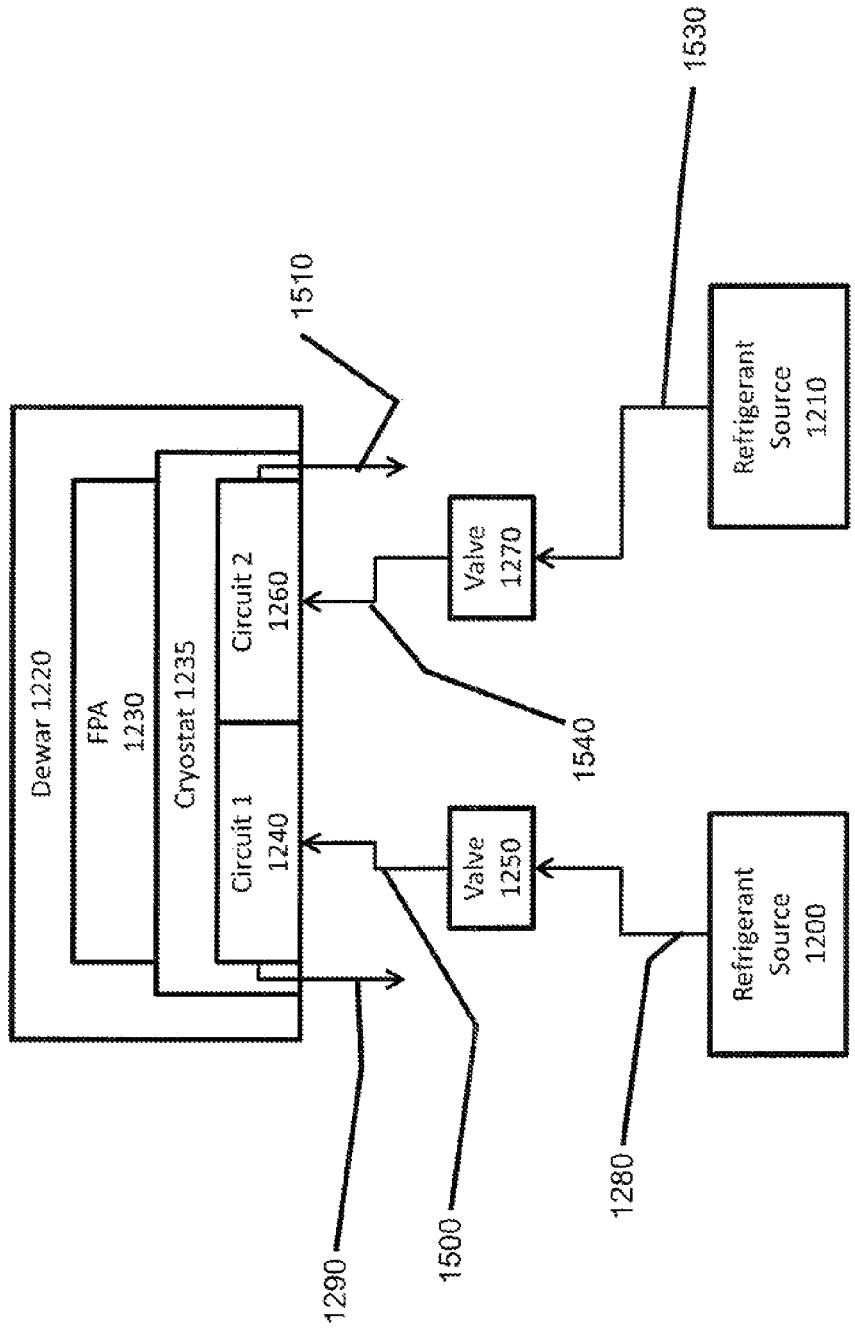

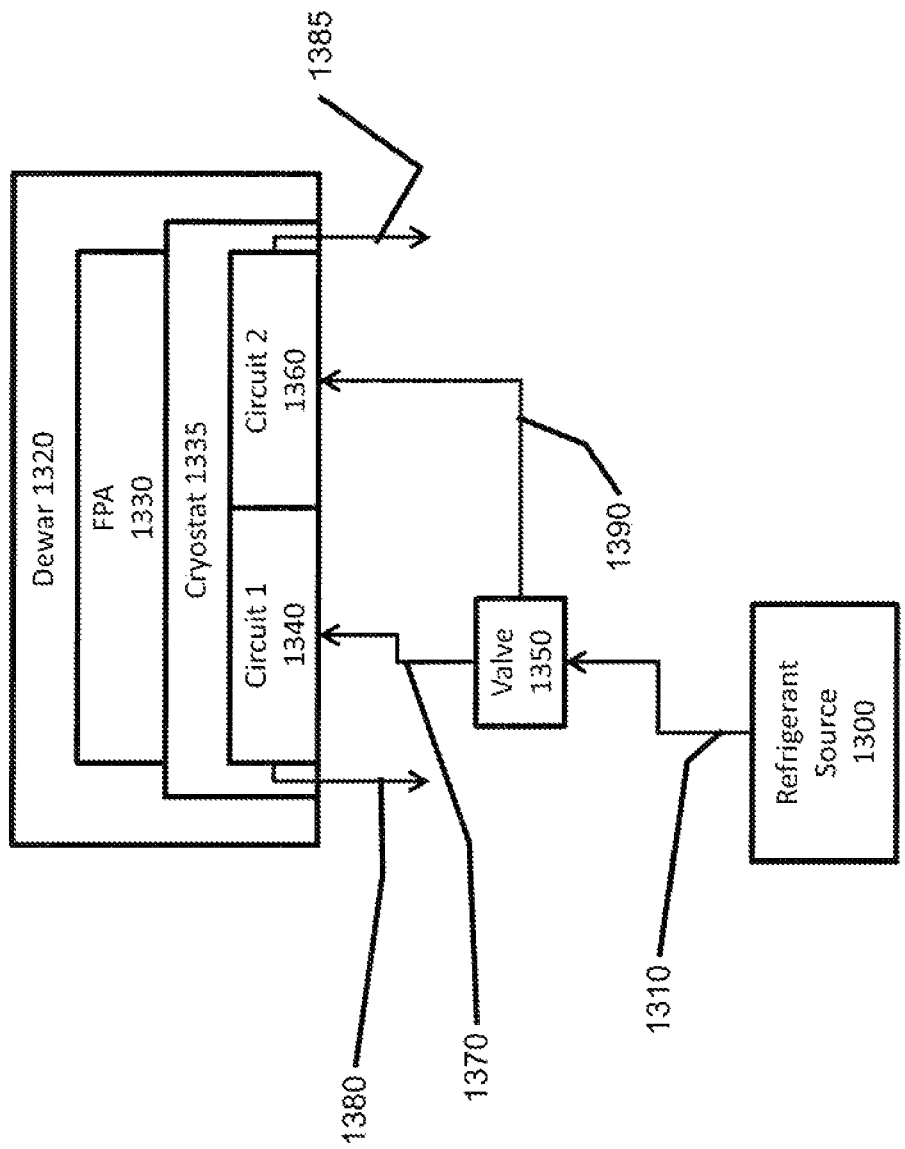

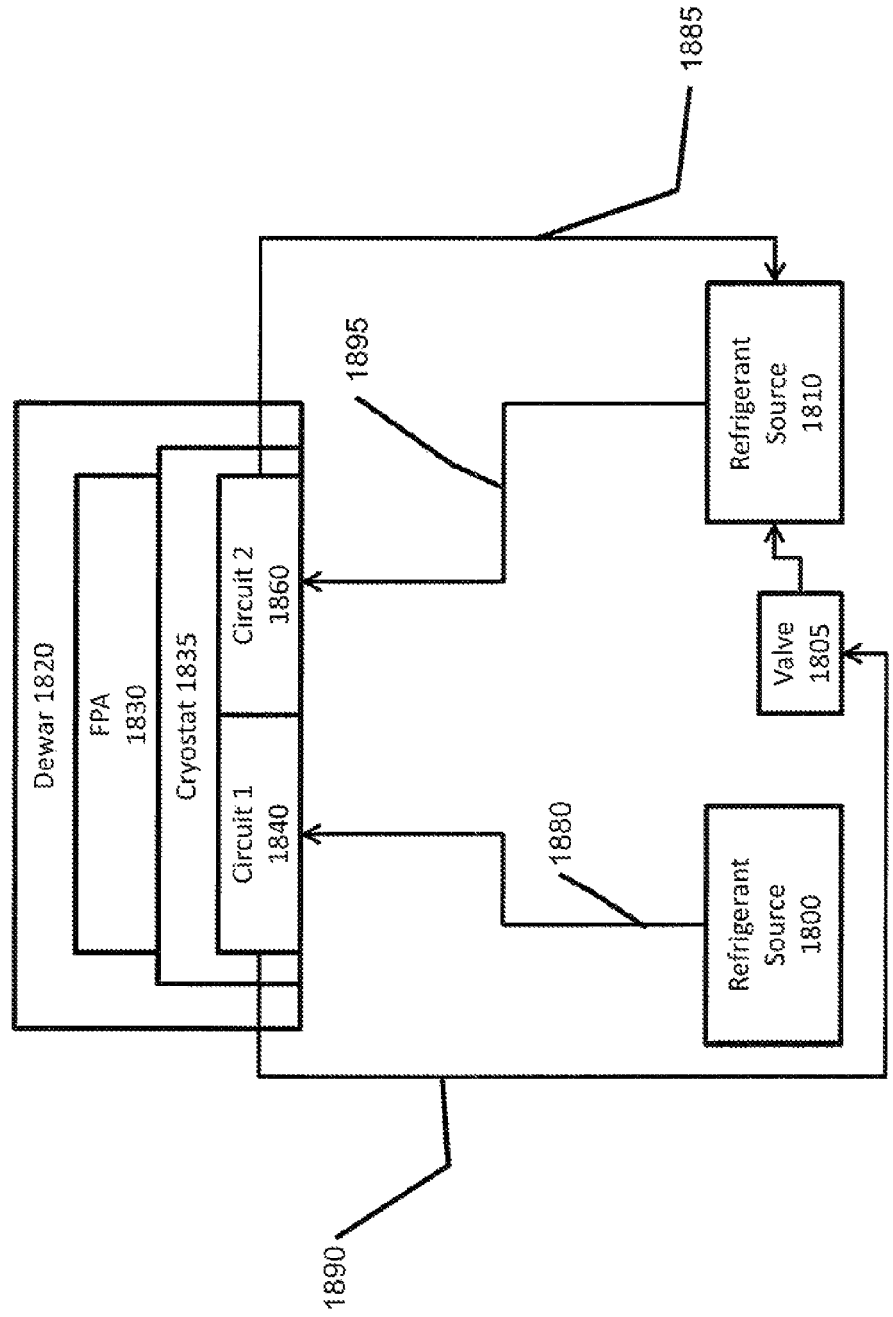

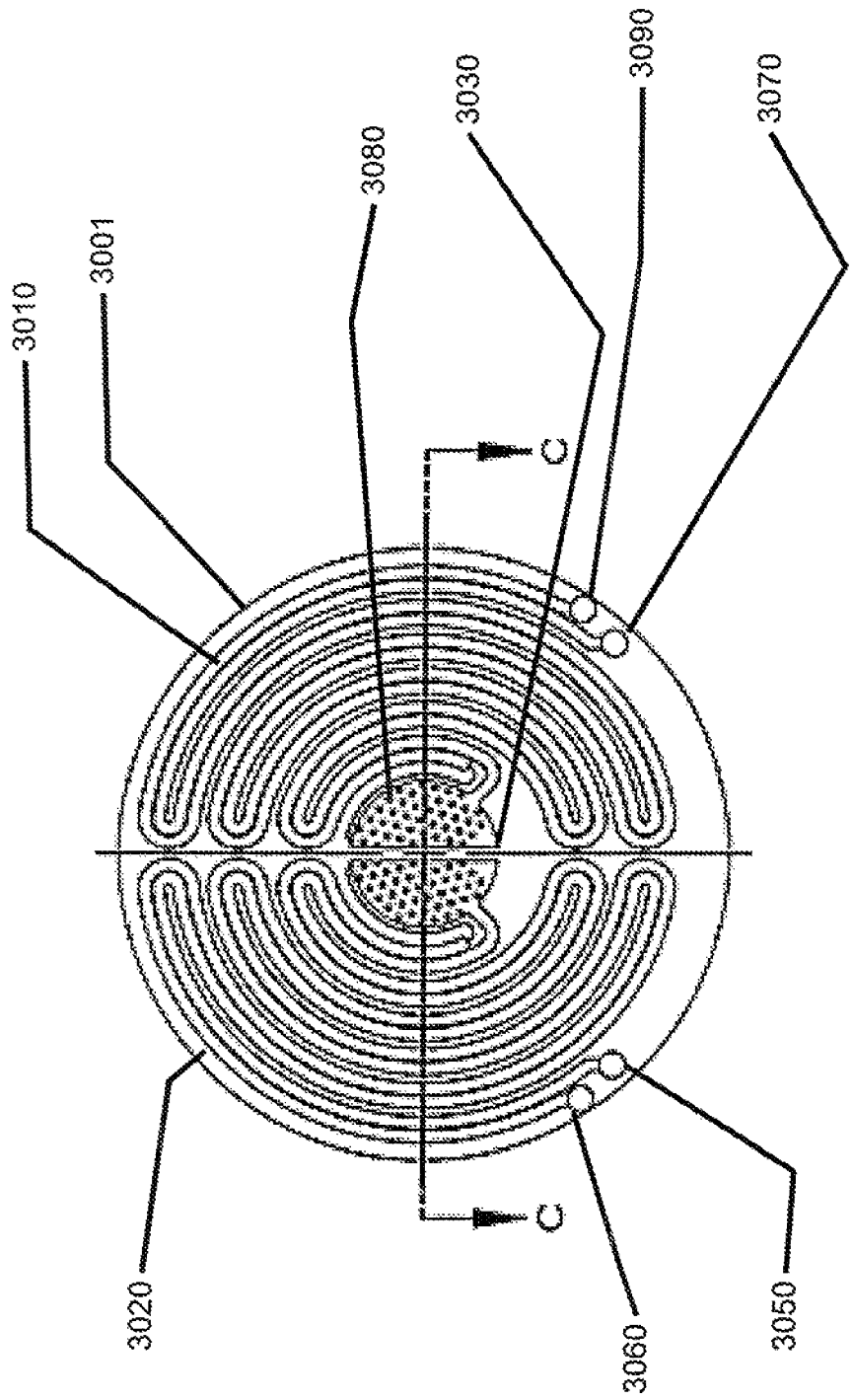

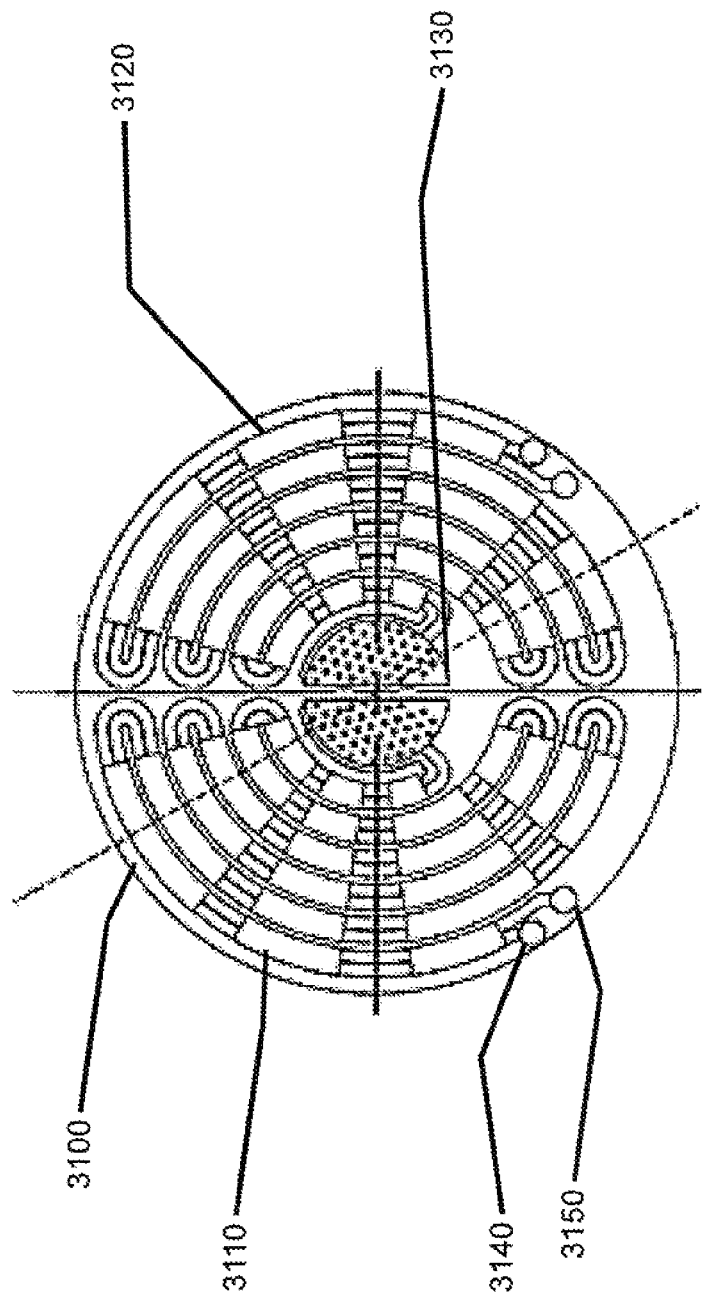

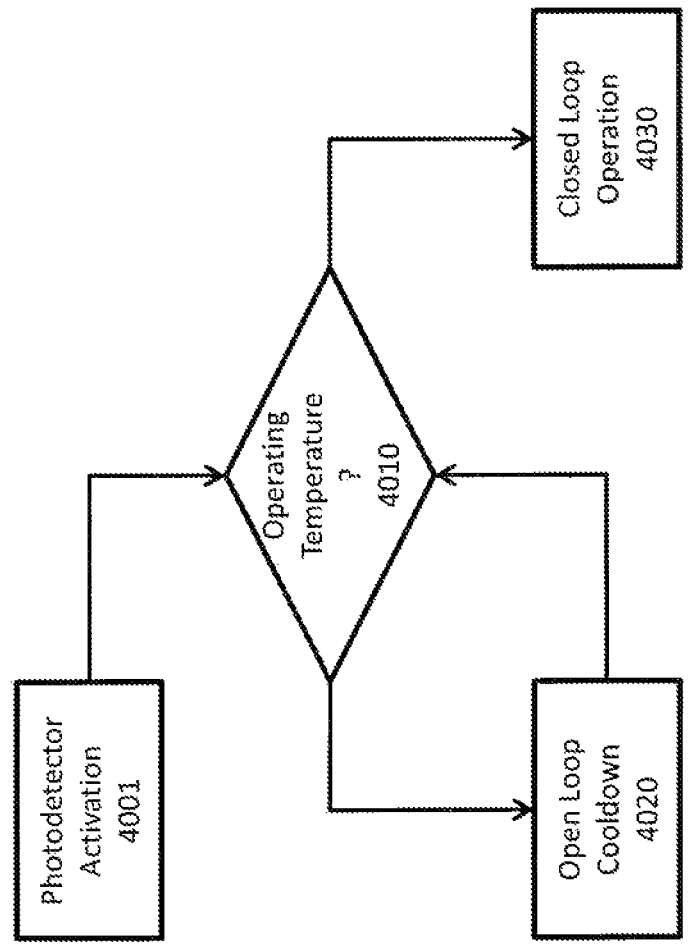

IDCA FOR FAST COOLDOWN AND EXTENDED OPERATING TIME

CROSS REFERENCE TO RELATED APPLICATIONS

This application is the National Phase of PCT/US2012/047688 filed Jul. 20, 2012, which claims priority under 35 U.S.C. 119(e) to U.S. Provisional Application No. 61/510,903 filed Jul. 22, 2011 and U.S. Provisional Application No. 61/530,312 filed Sep. 1, 2011, all of which are hereby expressly incorporated by reference into the present application.

BACKGROUND

For some IR sensor applications, it is generally not possible to meet two critical performance requirements with the same system design configuration: very fast cooldown time (seconds to reach Sensor operating temperature) and long system operational run times (enabling the system to operate for thousands of hours without maintenance or service). In some cases, the ability to abort a mission and re-use the device at a later date can be a desirable feature and adds operational flexibility. This is not possible with current technology.

The requirements for achieving very quick cooldown time to operating temperature and maintaining long operational run times are considered mutually exclusive for applications where weight, size and power are a premium. Applications such as a seeker on a missile or a surveillance sensor, generally need to be small, lightweight, portable and adaptable. So there is generally a trade-off between quick cooldown time and operational run time because of size and weight constrains.

Cryocoolers designed for applications requiring very fast turn on times are generally based on the Joule Thomson (J-T) effect because of the very high rates of cooling achievable with this cooling cycle. As a result, missile applications typically use conventional J-T cooling approaches because fast cooldown times are crucial to the program. However, J-T type coolers suffer from relatively short run times because of the size, weight and power penalty associated with running these coolers for long periods of time. J-T cryostats can be made very small, lightweight and compact but lack operational run time. To achieve very long operational run times, these coolers require either large reservoir volumes of very high pressure gasses or very large compressors to supply very high pressure gasses. Both solutions add to the size weight and power to the device.

Applications which require long run times are met with other types of coolers. These cryocoolers are generally Stirling and pulse-tube based and meet the long continuous operation requirements. They are small in size, light weight and have very high efficiencies. However, they cannot match the high cooling rates of J-T coolers and therefore suffer from longer cooldown times when compared to J-T cryostats. Making such Stirling and pulse-tube cryocooler systems have shorter cool-down times also adds bulk and power. Either solution results in very large, heavy and bulky systems.

Furthermore, the future trend in sensor technology is to employ larger sensors packaged in smaller spaces, light weight and requiring very low power to operate. In addition, these sensors have to be cooled reliably to operating temperatures and meet a host of other specific performance requirements such as the time the sensor requires to get to its operating temperature, the efficiency of the process, minimum input power to maintain temperature, the size and weight of the system, the operating time for a mission and the operating life of a system. Currently, the type of coolers used to achieve these performance requirements are large and are not easily adaptable to meeting diverse requirements because they were designed purely and solely for achieving cryogenic temperatures.

SUMMARY

Aspects of the techniques and solutions disclosed herein are directed at solving the above-noted problems of FPA cooling, IDCA size, power consumption, and operating times.

Variations of systems and solutions discussed herein may pertain to an integrated detector cooler assembly (IDCA) comprising: a cryostat having at least two cooling circuits disposed therein; and a first refrigerant source having a mixed-gas refrigerant to be provided to at least one of said cooling circuits; where a first of said cooling circuits is operable in a high-flow, rapid cooling mode; and a second of said cooling circuits is operable in low-flow, temperature maintenance mode.

In some variations, the IDCA may further include a compressor and be configured such that the first refrigerant source provides refrigerant to the first cooling circuit, said first cooling circuit being configured for open-loop operation; and the compressor provides refrigerant to the second cooling circuit, said second cooling circuit being configured for closed-loop operation.

In some variations, the IDCA may include a second refrigerant source and be configured such that the first refrigerant source provides refrigerant to the first cooling circuit, said first cooling circuit being configured for open-loop operation; and the second refrigerant source provides refrigerant to the second cooling circuit, said second cooling circuit being configured for open-loop operation.

In some variations, at least one cooling circuit is equipped with a gas expander portion, and where the gas expander portion is disposed in a center of the cryostat. In some variations, the cryostat is a planar, disk-shaped, Joule-Thomson (JT) cryostat. In yet further variations, the gas expander portion is the coldest portion of the cryostat, and an FPA disposed in the IDCA is positioned above the gas expander portion of the cryostat.

In further variations, at least one cooling circuit is configured to operate as a reverse-flow or counter-current heat exchanger, such that refrigerant entering the cooling circuit is cooled by refrigerant leaving the circuit. In some variations, the reverse-flow or counter-current heat exchanger may operate based on the principles demonstrated in U.S. Pat. No. 5,644,502, issued to Little on Jul. 1, 1997, the entire contents of which are hereby incorporated by reference.

In some variations, at least one cooling circuit includes heat-transfer bridges to transfer heat between high-pressure and low-pressure portions of the cooling circuit, where the high-pressure portion of the cooling circuit is associated with refrigerant flowing into the circuit and the low-pressure portion of the cooling circuit is associated with refrigerant flowing out of the circuit.

In some variations, the IDCA includes a control portion that controls operation of the first and second circuits by activating the first circuit to bring the photodetector to a desired operating temperature; and activating the second circuit to maintain the photodetector at the desired operating temperature.

In some variations, the IDCA includes a switching portion that controls a flow of refrigerant from the refrigerant source to at least one of the cooling circuits. In further variations, the IDCA includes a first switching portion that controls a flow of refrigerant from the first refrigerant source to the first cooling circuit; and a second switching portion that controls a flow of refrigerant to the second cooling circuit.

In some variations, the first and second cooling circuits are both equipped with said heat transfer bridges; the first and second cooling circuits are both equipped with gas expander portions disposed at a center of the cryostat; the cryostat a planar, disk-shaped Joule-Thomson cryostat; the first cooling circuit is disposed on a first half of the disk; and the second cooling circuit is disposed on a second half of the disk.

In other variations, the first and second cooling circuits are both configured to operate as reverse-flow heat exchangers. In some such variations, the first and second cooling circuits are both equipped with gas expander portions disposed at a center of the cryostat; the cryostat a planar, disk-shaped Joule-Thomson cryostat; the first cooling circuit is disposed on a first half of the disk; and the second cooling circuit is disposed on a second half of the disk.

Variations of systems and solutions discussed herein may pertain to a planar, disk-shaped J-T cryostat, the cryostat comprising: a first cooling circuit operable in a low-flow, temperature maintenance mode; a second cooling circuit operable in an high-flow, fast cooling mode; and a first refrigerant source providing a mixed-gas refrigerant to at least one of said cooling circuits; where the first and second cooling circuits are each equipped with a refrigerant inlet port and a refrigerant outlet port; and where the first and second cooling circuits are each configured to operate as reverse-flow heat exchangers such that refrigerant entering the circuit via the refrigerant inlet port is cooled by refrigerant leaving the circuit via the refrigerant outlet port.

In some variations, at least one cooling circuit is equipped with a gas expander portion disposed in a center of the cryostat, the gas expander portion being configured to receive high-pressure refrigerant via the refrigerant inlet port and direct low-pressure refrigerant to the refrigerant outlet port, such that the gas expander portion is the coldest portion of the cooling circuit. In further variations, each cooling circuit is equipped with the gas expander portion. In further variations, the second cooling circuit is configured to operate in an open loop mode and the first cooling circuit is configured to operate in a closed loop mode.

In some variations, the cryostat includes heat transfer bridges disposed on at least one cooling circuit, said heat transfer bridges being configured to enhance the reverse-flow heat exchange operation. In some such variations, the cryostat may include a single cooling circuit equipped with such heat-transfer bridges.

In some variations, the cryostat includes a compressor; the first refrigerant source providing refrigerant to the second cooling circuit; and the compressor providing refrigerant to the first cooling circuit. In further variations, the cryostat includes a second refrigerant source, where the first refrigerant source provides refrigerant to the first cooling circuit and the second refrigerant source provides refrigerant to the second cooling circuit.

Variations of systems and solutions discussed herein may pertain to a method of cooling a focal plane array (FPA) disposed in an integrated detector cooler assembly (IDCA) to an operating temperature, the method comprising: executing a rapid cooldown process to bring the FPA down to the desired operating temperature; and executing a temperature maintenance process to maintain the FPA at the desired operating temperature.

In some variations, the rapid cooldown process includes providing a pressurized gas refrigerant to a high-flow, open-loop cooling circuit included in a planar, disk-shaped Joule-Thomson cryostat included in the IDCA. In further variations, the temperature maintenance process includes providing a pressurized gas refrigerant to a low-flow cooling circuit included in a planar, disk-shaped Joule-Thomson cryostat included in the IDCA.

In some variations, the low-flow cooling circuit is a closed loop cooling circuit and where the pressurized gas refrigerant provided to the low-flow cooling circuit is provided by a compressor included in the IDCA. In further variations, the desired operating temperature includes a temperature range of 200K to 240K. In yet further variations, the desired operating temperature may include a temperature range of 100K to 140K. In further variations still, the desired operating temperature may include temperatures between 150K and 200K.

In some variations, the method further includes stopping execution of the temperature maintenance process in response to a de-activation signal provided to the FPA. In further variations, the method further includes receiving an activation signal directing the FPA to begin imaging, where said determining is performed in response to receiving said activation signal.

In some variations, the method further includes steps of determining whether the FPA is at the desired operating temperature; performing said rapid cooldown process in response to a determination that the FPA is not at the desired operating temperature; and performing said temperature maintenance process in response to a determination that the FPA is at the desired operating temperature Variations of systems and solutions discussed herein may pertain to planar, disk-shaped J-T cryostat, the cryostat comprising: a cooling circuit configured to operate as a reverse-flow heat exchanger such that refrigerant entering the circuit via a refrigerant inlet port is cooled by refrigerant leaving the circuit via a refrigerant outlet port; a refrigerant source providing a mixed-gas refrigerant to said cooling circuit; and heat transfer bridges disposed on said the cryostat along said cooling circuit, said heat transfer bridges being configured to enhance the reverse-flow heat exchange operation of the cooling circuit.

In some variations, the cooling circuit is equipped with a gas expander portion disposed in a center of the cryostat, the gas expander portion being configured to receive high-pressure refrigerant via the refrigerant inlet port and direct low-pressure refrigerant to the refrigerant outlet port, such that the gas expander portion is the coldest portion of the cooling circuit. In further variations, the heat transfer bridges include polysilicon. In yet further variations, the heat transfer bridges have a coefficient of thermal expansion (CTE) that matches the CTE of the cryostat.

In some variations, the cryostat further includes a second cooling circuit configured to operate as a reverse-flow heat exchange, where the heat transfer bridges are disposed on the cryostat along said first and second cooling circuits.

In some variations, the cryostat is formed from two glass plates, an upper plate and a lower plate. In some such variations, at least one of the cooling circuits is etched into the lower plate, the upper plate includes heat transfer bridge pockets to accommodate said heat transfer bridges therein, and the upper and lower plates are bonded together to form the cryostat.

Further scope of applicability of the techniques and solutions discussed herein will become apparent from the detailed description given hereinafter. However, it should be understood that the detailed description and specific examples, while indicating preferred embodiments of the techniques and solutions discussed herein, are given by way of illustration only, since various changes and modifications within the spirit and scope of the techniques and solutions discussed herein will become apparent to those skilled in the art from this detailed description.

BRIEF DESCRIPTION OF DRAWINGS

The techniques and solutions discussed herein will become more fully understood from the detailed description given herein below and the accompanying drawings which are given by way of illustration only, and thus are not limitative of the techniques and solutions discussed herein, and wherein

FIG. 1c depicts a block diagram of a variation of an IDCA with two cooling circuits as disclosed herein;

FIG. 1d depicts a block diagram of a variation of an IDCA with two cooling circuits as disclosed herein;

FIG. 1f depicts a block diagram of a variation of an IDCA with two cooling circuits as disclosed herein;

FIG. 3a depicts a variation of a planar cryostat having two cooling circuits as disclosed herein;

FIG. 3b depicts a variation of a planar cryostat having two cooling circuits as disclosed herein;

FIG. 4 depicts a flowchart showing a variation of an operating scheme for an IDCA with two cooling circuits as disclosed herein.

Figure 1A:
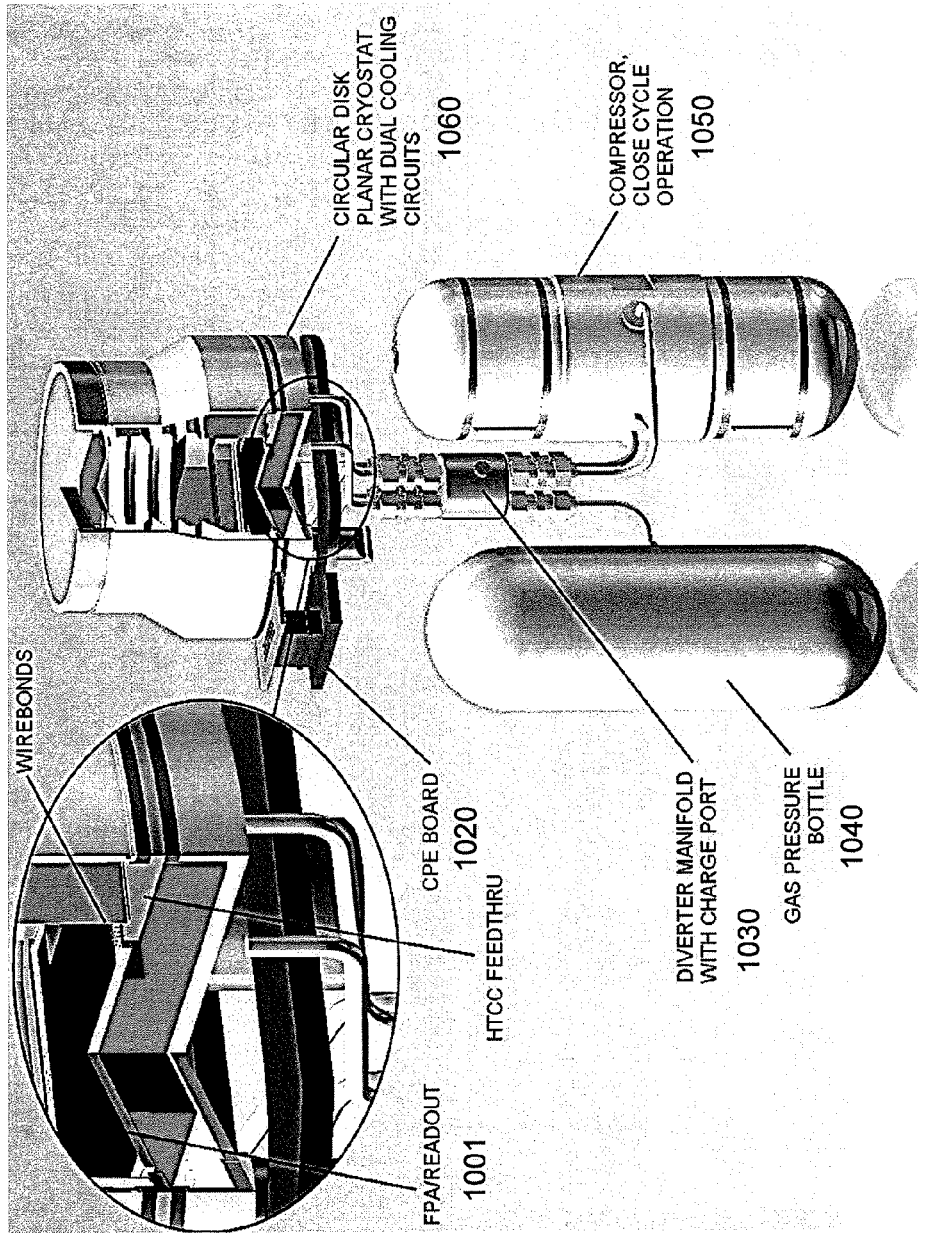
FIG. 1a depicts a variation of an IDCA with two cooling circuits as disclosed herein.

The drawings will be described in detail in the course of the detailed description of the techniques and solutions discussed herein.

DETAILED DESCRIPTION

The following detailed description refers to the accompanying drawings. The same reference numbers in different drawings identify the same or similar elements. Also, the following detailed description does not limit the techniques and solutions discussed herein. Instead, the scope of the techniques and solutions discussed herein is defined by the appended claims and equivalents thereof.

In view of the foregoing problems, it would be desirable to have a cooler which can meet the requirements of fast cooldown and long operation time while remaining small, lightweight, and relatively low-power. The purpose of this document is to address this problem and provide a design approach which will meet these requirements and be small in size, low weight and low input power. This Design provides a J-T cooler that achieves both performance requirements and meets size and weight constraints in the same system; i.e. providing both open and closed cycle modes of operation in the same IDCA (integrated detector cooler assembly), and thereby achieves both very fast cooldown and extended steady state continuous operation without the need for bulky gas reservoirs or bulky compressors. This Design also provides a method of operating a J-T cooler to achieve the above-stated objectives.

The above problem can be solved by bringing together three different technologies. The first is the performance of HOT (high operating temperature) photodetectors such as Infra-Red (IR) sensors, i.e. operating detectors at temperatures above 77K. The second is leveraging the high cooling efficiencies of mixed gas refrigerants at these high sensor operating temperatures. The third is incorporating the design and operation of planar geometry J-T cryostats to provide multiple J-T cooling circuits in the same planar cryostat, a technique not possible in traditional wound tube heat exchanger J-T cryostat designs.

An optimal preferred sensor temperature(s) may be selected for the HOT photodetector(s) in question. In some variations, a preferred temperature range for a HOT photodetector may be between 100K and 150K. In other variations, a preferred temperature range may be up to 250K or higher. In some variations, a HOT photodetector may be an IR detector configured to detect one or more frequency bands/ranges associated with long-wave, mid-wave, and short-wave IR.

Mixed gas refrigerants can then be tailored and, in some cases, optimized to meet the cooling rates and heat loads of the high temperature detector(s). The high enthalpy changes achievable with mixed gas refrigerants compared to traditional refrigerants, in conjunction with high operating temperatures make very fast cooldown times achievable. In addition, with mixed gasses, the peak pressures and flow rates required for efficient refrigeration can be substantially reduced compared to traditional refrigerants, in some cases by an order of magnitude or more. This makes possible the use of relatively small compressors to provide closed-cycle operation and allows operating in closed-cycle mode with a small compressor. Planar technology cryostat designs are flexible and make possible the integration of multiple cooling circuits in the same refrigeration stage of the Dewar and integrated in an IDCA.

In some variations, a fast cooldown loop may be activated to achieve fast cooldown time to make an MWIR sensor operable quickly, and then a valve or switching device or assembly (such as the diverter manifold shown above) may be used to change the cryostat over into a closed-loop mode that maintains the operating temperature of the device for an extended period and/or conserves refrigerant to allow for multiple activation cycles.

Variations of this concept leverage the advantages of HOT (high operating temperature) photodetectors such as nBn type MWIR detectors. Variations of HOT photodetectors may include devices having reduced dark noise or dark current. Some variations of such devices may include photo-detectors of the type taught in U.S. Pat. No. 7,687,871, issued to Shimon Maimon on Mar. 30, 2010, the entire contents of which are hereby incorporated by reference, and/or photo-detectors of the type taught in U.S. Patent Publication 2001/0037097 by Jeff Scott, Published on Feb. 17, 2011, the entire contents of which are hereby incorporated by reference, and/or of the type taught in U.S. Pat. No. 8,044,435, issued on Oct. 25, 2011 to Jeff Scott, the entire contents of which are hereby incorporated by reference, and also further variations thereon.

Mixed gas refrigerants are tailored and optimized to meet the cooling rates and heat loads of high temperature detectors. The very high enthalpy changes achievable with mixed gas refrigerants compared to traditional refrigerants, in conjunction with high operating temperatures make very fast cooldown times achievable. In addition, with mixed gasses, the peak pressures and flow rates required for efficient refrigeration can be substantially reduced compared to traditional refrigerants; i.e. an order of magnitude decrease. This makes possible the use of relatively small compressors to provide closed cycle operation and allows operating in close cycle mode with a small compressor.

Planar technology cryostats design are flexible and make possible the integration of multiple cooling circuits in the same refrigeration stage of the Dewar and integrated in an IDCA. This design provides a method of operating a JT cooler to achieve both performance requirements and meet size and weight constraints in the same system; i.e. provide both open and closed cycle modes of operation in the same IDCA and thereby achieves both very fast cooldown and extended steady state continuous operation without the need for bulky gas reservoirs or bulky compressors. A variation of such an IDCA design is shown in FIG. 1a.

In the variation shown, a gas pressure bottle 1040 may include a mixed gas refrigerant that includes one or more of methane, ethane, Argon, isobutene, nitrogen, krypton, propane, and R14. When a focal plane array (FPA) 1001 or photodetector disposed on the cryostat 1060 is activated, the diverter manifold 1030 may be engaged or switched over to open-loop operation such that the refrigerant from the gas pressure bottle 1040 quickly cools the FPA 1001 through an open loop cooling circuit in the cryostat 1060. In some variations, an FPA 1001 may reach a desired operating temperature within ten seconds or less.

When a desired operating temperature is achieved, the diverter manifold 1030 may be switched over to a closed-loop operation, stopping the flow of refrigerant from the gas pressure bottle 1040 and engages the compressor 1050, which activates to maintain the FPA 1001 at the desired operating temperature without a further significant loss of refrigerant. Although not preferred for quickly cooling an FPA 1001 to a desired operating temperature, a closed-loop compressor-based 1050 cooling system enables the cryostat 1060 to maintain the FPA 1001 at the desired operating temperature for a relatively long period of time. In some cases, compressor-based cooling can allow for extended ongoing operation of an infra-red FPA 1001 for up to an hour or longer. In some cases, the closed-loop cooling circuit can operate indefinitely so long as there is power to run the compressor 1050. In some such variation, a closed-loop cooling circuit may also bring the FPA 1001 down to an operating temperature, but such a cooldown process may take 30 minutes or longer as compared to ten seconds or less for a high-flow open loop system.

In some variations, switching to a closed loop operation may have no effect on the flow of refrigerant from the gas pressure bottle 1040. In such variations, the FPA 1001 may be meant for a single-use application or otherwise intended to only be activated once during the course of a mission or application. In such variations, the gas pressure bottle 1040 may be reduced in size such that it holds only enough refrigerant for 10 or 20 seconds of use in the open loop cooling mode. In some such variations, the diverter manifold 1030 may include or be replaced with a valve that controls the flow of refrigerant from the gas pressure bottle 1040. In further variations, the open loop and closed-loop cooling circuits may be activated simultaneously or concurrently, such that the closed-loop cooling circuit begins working to maintain an operating temperature for the FPA 1001 at the same time that the open loop cooling circuit begins working to reduce the operating temperature to the desired level.

The variation shown has a diverter manifold 1030 with a charge port. The charge port may accept a high-pressure refrigerant source or input that can feed a high-flow, open-loop cooling circuit in the cryostat 1060 and/or can charge a low-pressure reservoir 1040 that can feed a low-pressure, low-flow open loop cooling circuit in the cryostat 1060.

In some variations, where the FPA 1001 is intended for a single-use application, such as a missile seeker or a targeting feature of a single-use or limited-use weapon or device, the diverter 1030 and/or charge port may be omitted. In further variations, the diverter manifold 1030 may be replaced with a different type of switch or switching paradigm, such as one or more valves. In some variations, the open and closed loop circuits may each have a separate, independently controlled valve to allow for either or both of the cooling circuits to be closed off at any time.

The operating temperature of the FPA 1001, as well as the selection of open-loop or closed-loop cooling may be controlled by the CPE (close proximity electronics) board 1020. Variations of CPE boards 1020 may be custom-made devices or may be programmable devices that can be configured with a range of operating programs and parameters. The required logic and programs for control of both the IDCA and the FPA 1001 disposed in the IDCA may be realized through the CPE board 1020 included in the IDCA. In some variations, the FPA 1001 may include or otherwise be attached to a motherboard also disposed inside the dewar of the IDCA. A connector may pass from inside the dewar to the CPE board for transmission of signals between the FPA 1001 and downstream control and image processing components/systems.

The variation shown in FIG. 1a includes a cryostat 1060 having dual cooling circuits. The cryostat depicted has one cooling circuit disposed therein for open-loop cooling, and a second cooling circuit for closed-loop cooling. Such a variation helps prevent unwanted refrigerant loss from the closed-loop cooling system. In some such variations, the closed-loop and open-loop systems may be simultaneously active for some period while the FPA 1001 is being brought to operating temperature. In some such variations, the diverter manifold 1030 or cooling system switch/switches may be configured to allow both cooling systems to operate simultaneously. Such a variation is depicted in FIG. 1b.

Figure 1B:
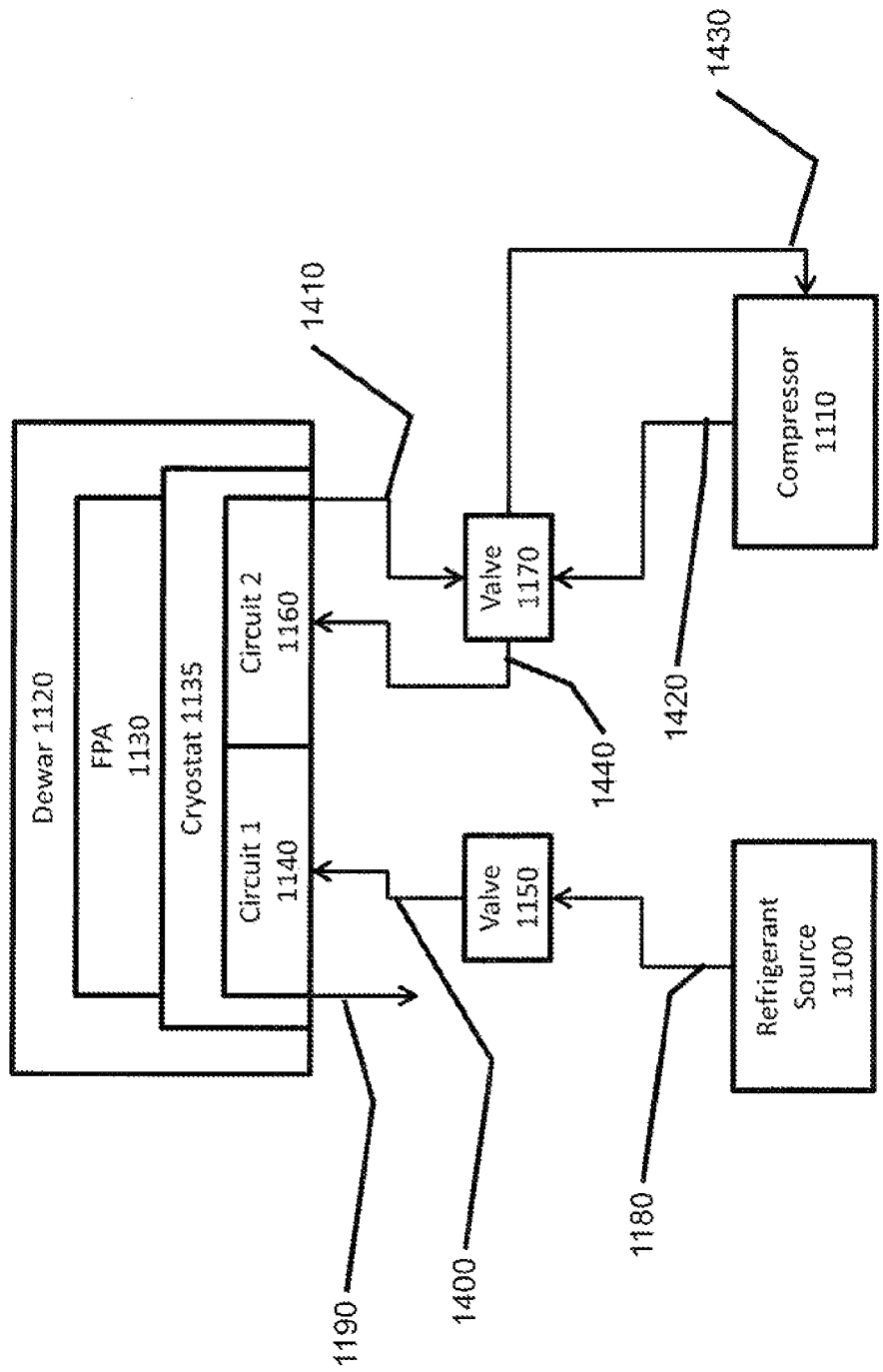
FIG. 1b depicts a block diagram of a variation of an IDCA with two cooling circuits as disclosed herein.

In the variation shown in FIG. 1b, an FPA 1130 is disposed in a dewar 1120 on a planar cryostat 1135 having a first 1140 and second 1160 cooling circuit. Although shown as being adjacent in the diagram, the cooling circuits 1140, 1160 may be arranged in any number of configurations, including intertwining/overlapping configurations. Cooling circuit layouts will be discussed later with respect to FIGS. 3a and 3b.

In the variation shown in FIG. 1b, a refrigerant source 1100 feeds the open loop cooling circuit 1140 through a coolant feed line 1180, 1400 that includes a valve 1150. In some variations, the valve 1150 may have only two positions—open and closed. In further variations, the valve 1150 may have a range of positions between fully open and fully closed. In some variations, the valve 1150 may include one or more valves and/or manifolds to control or regulate the flow of refrigerant from the refrigerant source 1100. In some variations, the refrigerant source 1100 may include a gas pressure bottle. Some variations of the refrigerant source 1100 may include replaceable cartridges such as ones similar in size and shape to commercially available $CO_2$ cartridges, except filled with mixed-gas refrigerant as discussed above.

The open cooling circuit 1140 includes an exhaust vent or exhaust line 1190, or some combination thereof, that allows the refrigerant to leave the cooling circuit 1140. In some variations, the valve 1150 or other flow control device may be disposed on the exhaust vent/line 1190 instead of the supply line 1180. Such variations may allow for both the refrigerant source 1100 and the refrigerant supply line 1180 to be replaced or otherwise re-configured without altering the operation of the IDCA. In further variations, the valve 1150 may feed directly into the cooling circuit 1140 without an intervening supply line 1400. Such variations may also allow for greater variation in the supply line 1180 arrangement and configuration, making the overall system more adaptable to a wider range of form factors.

In the variation shown in FIG. 1*b*, the second cooling circuit 1160 is a closed loop cooling circuit 1160 fed by a compressor 1110. The compressor feeds higher-pressure refrigerant gas into the cooling circuit 1160 via a supply line 1420 and recovers lower-pressure refrigerant gas from the cooling circuit 1160 via an exhaust line 1430. In some variations, the supply 1420 and exhaust 1430 lines may feed directly to and from the cooling circuit 1160. In further variations, one or more valves or switches 1170 may be disposed at ends of or along one or more of the exhaust 1410 and supply 1440 lines between the compressor 1110 and the cooling circuit 1160. Variations of valve(s) or switch(es) 1170 may be similar to the type usable with the open-loop refrigerant supply line 1180. Further variations may include valve(s) 1170 having flow-regulation capabilities to help maintain desired pressures in the supply 1440 and/or exhaust 1410 lines.

In further variations, the closed loop cooling circuit may be replaced with a low-flow, low pressure open cooling circuit. Because such a cooling circuit is meant to maintain temperature as opposed to reduce temperature, refrigerant expenditure in the low-flow mode may be significantly less than in the high-flow, temperature reducing mode associated with the high-flow open loop cooling circuit. In some such variations, the IDCA may be configured with two coolant sources—one for high-flow temperature reduction and one for low-flow temperature maintenance. Such a variation is shown in FIG. 1*c*.

In the variation shown in FIG. 1*c*, an FPA 1230 is disposed in a dewar 1220 on a planar cryostat 1235 having a first 1240 and second 1260 cooling circuit. In the variation shown, the first 1240 and second 1260 cooling circuits are both open loop type cooling circuits equipped with exhausts 1290, 1510 that allow for the release/loss of refrigerant gas.

First 1200 and second 1210 refrigerant sources feeds the respective open loop cooling circuits 1240, 1260 through coolant feed lines 1280, 1530 that each include a valve 1250, 1270. In some variations, one or both valves 1250, 1270 may have only two positions—open and closed. In further variations, one or both valves 1250, 1270 may have a range of positions between fully open and fully closed. In some variations, the valves 1250, 1270 may be combined into an overall assembly of one or more valves and/or manifolds to control or regulate the flow of refrigerant from one or both refrigerant sources 1200, 1210. In some variations, one or both of the refrigerant sources 1200, 1210 may include a gas pressure bottle. Some variations of the refrigerant sources 1200, 1210 may include replaceable cartridges such as ones similar in size and shape to commercially available $CO_2$ cartridges, except filled with mixed-gas refrigerant as discussed above.

Each open cooling circuit 1240, 1260 includes an exhaust vent or exhaust line 1290, 1510 or some combination thereof, that allows the refrigerant to leave the cooling circuits. In some variations, the valves or other flow control devices may be disposed on the exhaust vent/lines 1290, 1510 instead of the supply lines 1280, 1530. Such variations may allow for either or both of the refrigerant sources 1200, 1210 and/or the associated refrigerant supply lines 1280, 1530 to be replaced or otherwise re-configured without altering the operation of the IDCA. In further variations, the valves 1250, 1270 or valve assembly may feed directly into the cooling circuits 1240, 1260 without intervening supply lines 1500, 1540. Such variations may also allow for greater variation in the supply line arrangement and configuration, making the overall system more adaptable to a wider range of form factors.

In the variation shown in FIG. 1*c*, the first cooling circuit 1240 may be a high-flow open loop cooling circuit meant to provide rapid temperature decrease. The second cooling circuit 1260 may be a low-flow open loop cooling circuit meant to provide temperature maintenance after an initial cooldown. In some such variations, the first refrigerant source 1200 may be exhausted after between ten and thirty seconds of use in the high-flow circuit 1240 whereas the second refrigerant source 1210 may provide anywhere between 30 minutes and several hours of temperature maintenance to keep the cooled FPA 1230 at a desired operating temperature. In some variations, the valves 1250, 1270 may be simultaneously triggered into a fully open state, with no closure or refrigerant flow stoppage permitted or otherwise intended. Such variations may be suitable for single-use devices such as cruise missiles. Such variations may also be suitable for devices having significant weight or power consumption limitations, or other devices where a limited usable lifetime or the need to swap out cooling cartridges is preferable to using/operating a compressor.

In further variations, the low-flow cooling circuit 1260 may be configured such that it is equipped with a compressor for closed-loop operation, but also equipped with valves or switching devices and a refrigerant source 1210 as a back-up. Such a cooling circuit may be configured to change from a closed-loop operation to a low-flow open-loop operation in the event of compressor failure. Such a solution may allow for an FPA 1230 to remain at operating temperature for some period of time despite a mechanical failure.

In further variations, there may be only a single source of refrigerant for the IDCA. Such a variation is shown in FIG. 1*d*. In the variation shown in FIG. 1*d*, an FPA 1330 is disposed in a dewar 1320 on a planar cryostat 1335 having a first 1340 and second 1360 cooling circuit. In the variation shown, the first 1340 and second 1360 cooling circuits are both open loop type cooling circuits equipped with exhausts 1380, 1385 that allow for the release/loss of refrigerant gas.

In the variation shown, the supply line 1310 from the refrigerant source 1300, which may be a gas pressure bottle or a coolant cartridge or similar device, may feed into a valve 1350 or manifold or similar switching and/or flow control device. In some variations, such a coolant cartridge may be configured to be readily swappable or otherwise replaceable, allowing the refrigerant source of the IDCA to be recharged periodically.

In the variation shown, the valve 1350 has two feed lines leading from it. The first feed line 1370 may be a high-flow feed line leading to a high-flow open loop cooling circuit 1340 meant to quickly cool the FPA 1330 down to a desired operating temperature. The second feed line 1390 may be a low-flow feed line leading to a low-flow open loop cooling circuit 1360 meant to maintain the FPA 1330 at the desired operating temperature after the initial cooling.

In some variations, the valve 1350 may be an integral part of the IDCA assembly, with the feed lines 1370, 1390 being internal. In some variations, the valve 1350 may have an off position, a high flow position, and a low flow position. In the off position, the valve 1350 prevents any flow of refrigerant from the source 1300 to the cryostat 1335. In the high flow position, the valve allow flow from the source 1300 to the high-flow circuit 1340. In some variations, the high flow position may allow flow from the source 1300 to both the high flow and low flow circuits 1340, 1360. In further variations, the high flow position may allow flow only to the high flow circuit 1340. In some variations, the low flow position may allow flow only to the low flow circuit 1360.

In some variations, once opened, the valve 1350 or switching assembly/manifold may not be closed. In some such variations, the valve 1350 may only move from a closed position to a high flow position and then to a low flow position, where it remains until all the refrigerant is exhausted or until manually/externally reset. Such a variation may be useful for detectors in remote security or surveillance systems where a detector may operate for a fixed period of time after being triggered into activation.

Further variations may have a valve or switching device 1350 with a continuous range of motion or more than three discrete settings. In some variations, such a valve may be controlled by the process control electronics of the IDCA. In some variations, such a valve may be fully reclosable during operation, allowing for as many cooldown and temperature maintenance cycles as can be accomplished given the available refrigerant.

In some variations, having a single refrigerant source 1300 may allow for further reductions in form factor and additional flexibility in arranging a feed line from the source 1300 to the valve/flow control 1350. In all the variations discussed above, refrigerant is provided to the cooling circuits in a DC mode. This allows the refrigerant feed lines to be significantly longer than those of an AC mode cooling device.

Figure 1E:
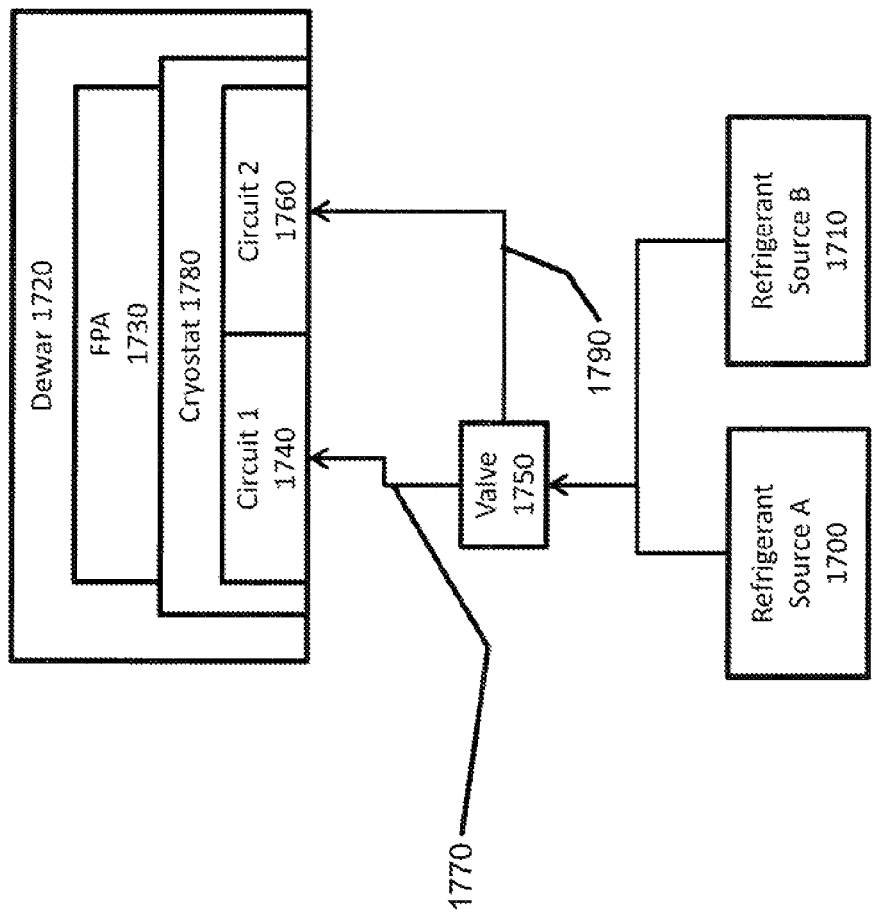
FIG. 1e depicts a block diagram of a variation of an IDCA with two cooling circuits as disclosed herein.

In other variations, the IDCA may be equipped with a back-up or secondary refrigerant source. Such a variation is shown in FIG. 1e. In the variation shown in FIG. 1e, an FPA 1730 is disposed in a dewar 1720 on a planar cryostat 1735 having a first 1740 and second 1760 cooling circuit. In the variation shown, the first 1740 cooling circuit may be a high-flow open-loop type cooling circuit whereas the second cooling circuit 1760 may be a low-flow temperature maintenance type cooling circuit. The second cooling circuit 1760 may be an open loop circuit, a closed loop circuit, or may be switchable between open and closed loop operating modes.

In the variation shown, a primary refrigerant source 1700 may supply coolant to either or both cooling circuits 1740 along coolant feed lines 1750 controlled or regulated by a valve or diverter 1750. In some variations, the valve 1750 may also control coolant flow between the primary refrigerant source 1700 and a secondary refrigerant source 1710. In some variations, if the primary refrigerant source 1700 is exhausted, inaccessible, damaged, or otherwise unavailable, the valve 1750 may switch over to the secondary refrigerant source 1710 to keep the IDCA cooled and the FPA 1730 at a desired operating temperature.

In a variation where the primary refrigerant source 1700 is a compressor supplying refrigerant only to the second cooling circuit 1760, the secondary refrigerant source 1710 may be a second compressor or a pressurized gas bottle or cartridge. In the event the primary compressor 1700 fails or becomes inoperable, the valve 1750 may switch over to the secondary refrigerant source 1710, which may be another compressor or may be a pressurized refrigerant source. In a variation where the secondary refrigerant source is a pressurized refrigerant source 1710, a refrigerant exhaust line (not shown) that would normally feed refrigerant from the cooling circuit 1760 back to the compressor may be switched or otherwise set into an open position such that the exhaust refrigerant is released into the atmosphere. In some variations, this may also be accomplished by the valve 1750.

In other variations, refrigerant for a low-flow circuit of the IDCA may be captured or recovered from the high-flow refrigerant source or from exhaust from the high-flow circuit. Such a variation is shown in FIG. 1f. In the variation shown in FIG. 1f, an FPA 1830 is disposed in a dewar 1820 on a planar cryostat 1835 having a first 1840 and second 1860 cooling circuit. In the variation shown, the first 1840 cooling circuit may be a high-flow open-loop type cooling circuit whereas the second cooling circuit 1860 may be a low-flow temperature maintenance type cooling circuit. The second cooling circuit 1860 may be an open loop circuit, a closed loop circuit, or may be switchable between open and closed loop operating modes.

The IDCA may be equipped with a first refrigerant source 1800 that is configured to provide refrigerant to the high-flow cooling circuit 1840. This may be provided by a refrigerant feed line 1880 which may, in some variations, be equipped with or otherwise controlled by a valve or manifold or other flow control device. The high-flow circuit 1840 may also be equipped with a refrigerant exhaust line 1890 that allows 'used' or spent refrigerant to leave the high-flow cooling circuit 1840. In some variations, this exhaust line may vent into the surrounding atmosphere. In other variations, the exhaust line may feed into a second refrigerant source 1810 either directly or through a valve 1805, such as a check valve, or other flow control device.

In some variations, the valve 1805 may be configured to prevent an amount of refrigerant or level of refrigerant pressure in the second refrigerant source 1810 and its associated cooling circuit 1860 from reaching or exceeding a certain threshold level. In such variations, when such a threshold level is reached, the valve 1805 may cause any additional refrigerant leaving the high-flow circuit 1840 to be vented into the atmosphere or otherwise directed to a different destination (such as, for example, a back-up low-flow/low-pressure refrigerant source [not shown]).

The second refrigerant source 1810 may be a compressor that feeds the low-flow cooling circuit 1860 in a closed-loop mode, so that refrigerant recovered from the first cooling circuit 1840 is fed, via a refrigerant feed line 1895, to the low-flow circuit 1860. The refrigerant may then be recovered from the low-flow cooling circuit 1860 via an exhaust line 1885 that feeds the refrigerant back into the compressor 1810.

In another variation, the second refrigerant source 1810 may be a low-pressure reservoir fed and maintained by the refrigerant leaving the high-flow circuit 1840. In such a variation, the refrigerant exhaust line 1885 from the low-flow cooling circuit 1860 may vent into the atmosphere or into a recovery reservoir for later processing or disposal.

In yet another variation, refrigerant for the low-flow refrigerant source 1810 may be acquired directly from the high-flow refrigerant source 1800 instead of and/or in addition to being recovered as cooling circuit exhaust 1890. In such variations, the high-flow cooling circuit may either feed the second refrigerant source 1810 or vent into the atmosphere. Another feed line (not shown) may go directly from the first refrigerant source 1800 to the second refrigerant source 1810. Such a feed line may pass through a valve or manifold or flow/pressure control device. In some such variations, the refrigerant source 1800 of the high-flow cooling circuit 1840 may simultaneously feed 1890 the high-flow cooling circuit 1840 and provide refrigerant to the second refrigerant source 1810 for operation of the low-flow cooling circuit 1860.

Variations of the solutions described above solve both very fast cooldowns for missile type applications and provides a means for operating the IDCA in a continuous closed-cycle mode to support missions with very long periods of operation. Such a mixed operation paradigm combines the desirable features of or technologies currently used separately to solve applications requirements.

Figure 2:
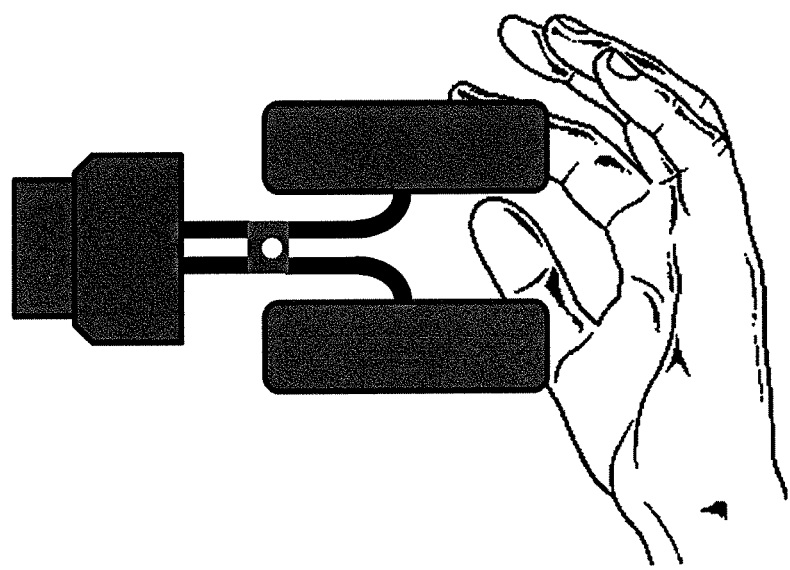
FIG. 2 depicts a variation of an IDCA with two cooling circuits as disclosed herein.

As can be seen from FIG. 2, variations of such a solution may be designed with a relatively small form factor. In some variations, such a two-circuit cooling solution may be designed small enough for hand-held devices and similar solutions having limited space and weight requirements (such as, for instance, aircraft and rocket-propelled devices).

A variation of a planar cryostat is shown in FIG. 3. In the variation shown, the cryostat 3001 is a circular disk planar J-T type cryostat. Further variations may use different cryostat shapes, such as rectangular or polyhedral shapes and/or non-planar arrangements.

In the variation shown, the cryostat has two cooling circuits, a high-flow, fast cooling circuit 3020 and a low-flow, temperature maintenance circuit 3010. The high-flow circuit 3020 may be an open-loop cooling circuit equipped with a refrigerant inlet point 3060 and an exhaust point 3050. The refrigerant rapidly cools the cryostat by entering the cryostat at the inlet point 3060 and then rapidly passing through the open loop cooling circuit 3020 before being vented to the atmosphere via the exhaust point 3050.

In the variation shown, the 'cold finger' normally extending from a cryocooler is replaced by the central portion 3030 of the cryostat. The central portion 3030 is separated into two halves, which each half being connected to one of the cooling circuits in the cryostat 3001. Each central portion half 3030 includes baffles 3080 disposed in a chamber meant to take in high-pressure refrigerant and allow it to quickly expand. The rapid gas expansion causes the chamber to become a local low-pressure area, which reduces its temperature. The low-pressure refrigerant then flows to the exhaust point 3050 along a pathway adjacent to the gas inlet pathway. This arrangement allows the low pressure refrigerant to pre-cool incoming high-pressure refrigerant, further enhancing the effectiveness of the cooling operation. Upon reaching the exhaust point 3050, the low pressure refrigerant is vented or otherwise expelled from the cooling circuit in an open-loop configuration.

By replacing the 'cold finger' with a gas expander 3030 in the middle of the cryostat, an overall size of the IDCA is further reduced. Additionally, mechanical complexity is reduced both by making the IDCA smaller and also by reducing the number of components included therein. Furthermore, a cryostat 3001 equipped with a gas expander 3030 cold portion can be operated by providing DC flow of refrigerant, allow for the refrigerant supply lines to be longer and more varied in shape. This enables the IDCA and its associated refrigerant sources/compressors to accommodate a wider range of form factors. In some variations, a refrigerant source may be disposed at a significant remove from the IDCA, allowing for remote operation and temperature maintenance of the detector and IDCA.

In the variation shown, the low-flow cooling circuit 3010 may be either a closed loop or an open loop circuit. An open loop circuit would operate in a manner similar to the high-flow circuit 3020, but with reduced gas flow rates. In the variation shown, closed-loop cooling operation may be realized by providing refrigerant into the closed-loop cooling circuit 3010 via the closed-loop refrigerant entry point 3090. The coolant moves through the closed-loop circuit, which functions as a reverse-flow heat-exchanger, introducing high-pressure refrigerant gas that is then allowed to expand to a lower-temperature in the central chamber 3030. The lower-pressure gas is then fed back into a compressor at the closed-loop refrigerant return point 3070.

In the variation shown, the low-flow cooing circuit also allows the low pressure refrigerant to flow to the exhaust point 3070 along a pathway adjacent to the gas inlet pathway to pre-cool the incoming high-pressure refrigerant before it reaches the expansion chamber 3030, further enhancing the effectiveness of the cooling operation.

Some cryostat variations may realize further improvements in cooling efficiency by further enhancing the pre-cooling portion of the cooling operation. The variation shown in FIG. 3b realizes such further enhancement by having heat transfer bridges 3110, 3120 disposed along the high flow and low flow refrigerant circuits in the cryostat 3100. These bridges may be polysilicon bridges or made of other materials having high thermal conductivity. Preferably, such bridges are made of a material having a coefficient of thermal expansion (CTE) that matches or approaches the CTE of the cryostat 3100. Such bridges 3110, 3120 may have improved heat transfer/thermal conduction properties, which may be used to enhance the effectiveness/efficiency of the heat exchanger operation by enhancing the pre-cooling effect of the outflowing refrigerant 3150 on the inflowing refrigerant 3140, enabling the central chamber 3130 to be cooled more effectively. Such heat transfer bridges 3110, 3120, strapping laterally between the input 3140 and output 3150 lines of a cooling circuit but broken into sections along the length of the lines, can provide increased heat exchanger efficiency while maintaining a high thermal impedance along the length of the lines.

Such heat transfer bridges may be useful in planar JT structures for improved efficiency, both in the case of a JT cryostat 3100 with multiple cooling circuits or a cryostat with a single cooling circuit. In some variations, a cryostat 3100 may be equipped with a single cooling circuit equipped with such heat-transfer bridges 3110, 3120 for improved operating efficiency of the cooling circuit.

Variations of a cryostat 3100 may include a planar, disk-shaped Joule-Thomson cryostat made from two glass plates, with the cooling circuits being etched into or otherwise created between the plates. In some such variations, the heat transfer bridges 3110, 3120 may be applied to a top plate of the cryostat at locations along the cooling circuit(s). In some variations, the heat transfer bridges 3110, 3120 may be applied to one of the cryostat 3100 plates before the cooling circuit(s) is/are created within the cryostat. For polysilicon heat transfer bridges 3110, 3120 used with a glass plate, such bridges may be applied using a range of techniques suitable for depositing/adhering polysilicon onto glass. One design uses bridge pockets etched into the upper glass plate which are filled by sputtering with polysilicon then chemically and/or mechanically (or chem.-mechanically) polished flat. The lower glass plate, which may have the cryostat lines etched into channels, is then bonded to the upper plate to complete the planar cryostat 3100. Other application techniques may vary based on the material compositions of the cryostat 3100 and the heat transfer bridges 3110, 3120. Some variations may use quartz, ceramics, different types of glass, polyimide or other material types for the cryostat 3100. Variations may also use materials such as copper or other thermally conductive materials for heat transfer bridges 3110, 3120.

Figure 3C:
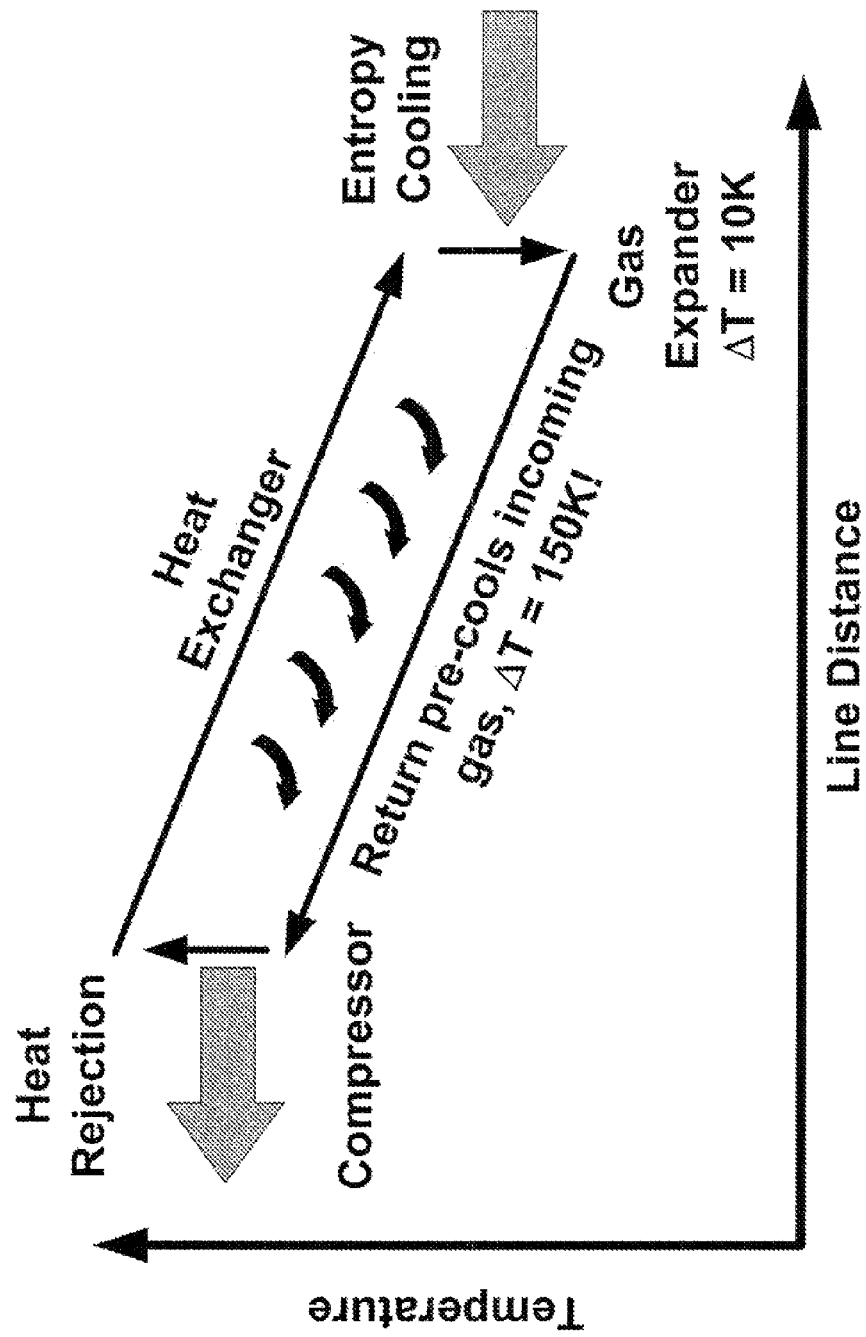
FIG. 3c depicts a variation of heat exchange operation for a variation of a planar cryostat having a closed loop cooling circuit as disclosed herein.

An example of the improvements realized by such pre-cooling in a closed-loop cooling circuit are shown in FIG. 3c. As can be seen from the diagram, the gas expander, which is the central chamber 3130 portion of the cryostat, provides approximately 10K worth of cooling. By contrast, the heat exchange realized in the pre-cooling operation can provide approximately 150K worth of cooling. These ranges are noted only for the sake of example and are not meant to be limitative on the operation or operating ranges of the cryostat or cooling circuit(s) therein.

An example of an activation cycle for an IDCA of the type described herein is shown in FIG. 4. When a photodetector is activated for operation 4001, a check may be performed to determine whether the detector is at a suitable operating temperature 4010. In some variations, such a check may be performed by measuring a temperature reading device in the cryostat 3001. Variations of such a temperature reading device may include a thermocouple or similar device whose electronic or conductive properties change based on temperature. Further variations may include a temperature sensor disposed on the FPA/photodetector that is read by the close proximity electronics in the IDCA. If the operating temperature is deemed too high, an open loop cooldown procedure 4020 may be initiated. Such an open-loop cooldown 4020 may continue until a desired/required operating temperature is reached. After detecting or measuring a desired operating temperature 4010, a closed loop cooling cycle 4030 may be engaged to keep the photodetector at the desired operating temperature during the rest of the active/detection period.

In some variations, a photodetector activation signal 4001 may include a signal indicating a rapid or unexpected detector activation. Variations of a closed-loop cooling system equipped with a compressor may bring a photodetector down to a desired operating temperature without relying on open-loop cooling. Such closed-loop temperature reduction may take a long time, however. A level of cooling that can be realized with an open-loop, high-flow solution in under ten seconds may take up to 30 minutes to achieve with a closed-loop, low-flow cooling circuit.

Some variations may have a photodetector configured to operate primarily with a closed-loop cooling solution. Such variations, such as certain types of surveillance or monitoring systems, may have a regular operating schedule of compressor activation followed by a period of image acquisition, followed by shutdown. Such a solution may allow for effectively indefinite operation on such regular intervals so long as there is sufficient power to operate the compressor and the detector.

Some variations of such a system may be configured to automatically commence imaging if certain sensors, such as proximity or motion sensors, are triggered, or if certain other environmental conditions are met. A geological monitoring system, such as a system monitoring a volcano for example, may be configured to gather a handful of images per day unless a threshold seismic or temperature event is detected. Such an event may be treated as a photodetector activation signal 4001. If the photodetector is not on a regular duty cycle at the time of signal triggering, it is likely not at the desired operating temperature 4010, and therefore must rapidly be cooled 4020 to commence imaging. Similar solutions may be realized for weather monitoring and security systems.

Figure 5:
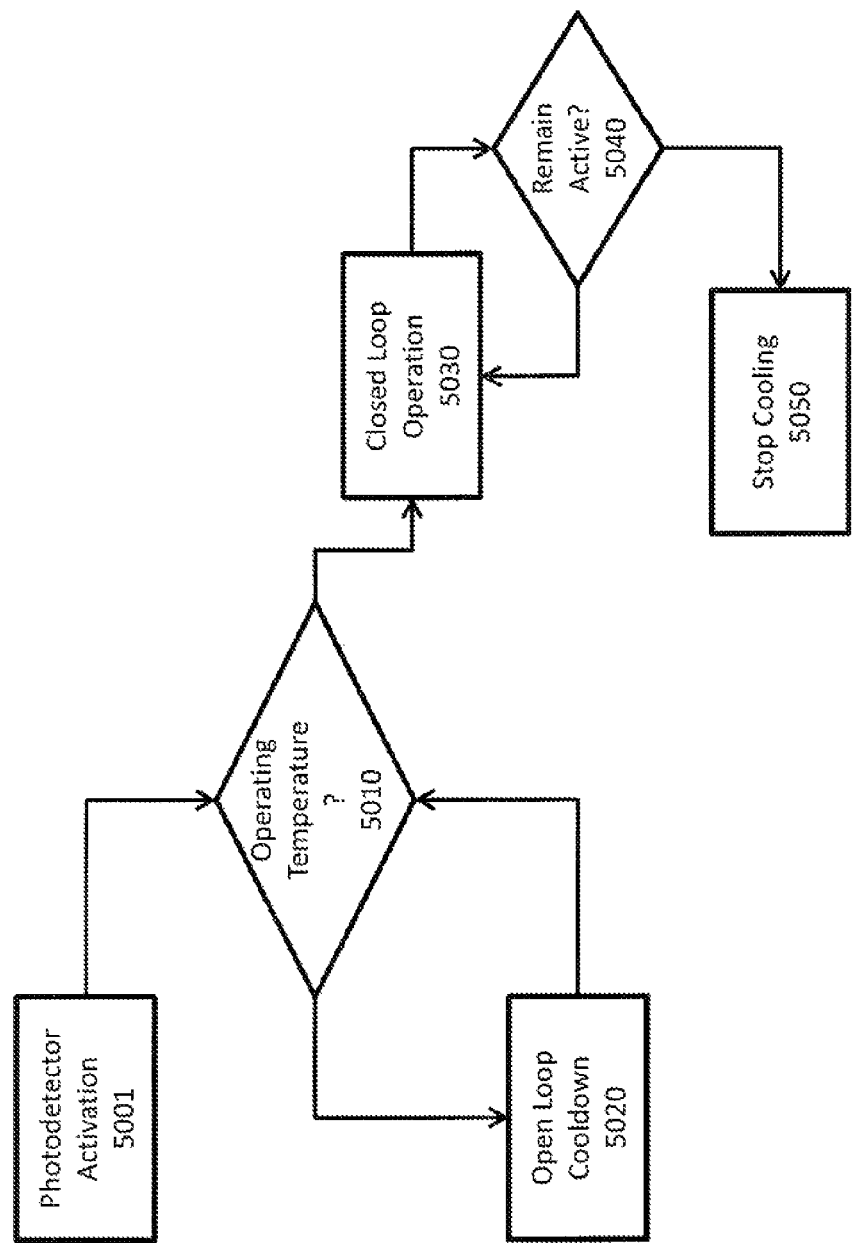
FIG. 5 depicts a flowchart showing a variation of an operating scheme for an IDCA with two cooling circuits as disclosed herein.

A variation of an operation cycle for an IDCA of the type described herein is shown in FIG. 5. In the variation shown, a signal or other indicator requesting or requiring photodetector activation 5001 may prompt the IDCA to determine whether the photodetector is at a suitable operating temperature 5010. Such a determination may be made by reading a temperature sensor included the FPA or by reading a temperature sensor included in the cryostat. If the photodetector is not at a suitable operating temperature (such as, for example, 77K or less for a traditional IR photodetector or ~240K or less for reduced dark current nBn type photodetectors) 5010, an open loop fast cooldown process 5020 is initiated. Such a fast cooldown 5020 may include releasing a mixed-gas refrigerant from a cartridge or gas pressure bottle attached to or switched into a high-flow open loop cooling circuit connected to the cryostat on which the photodetector is disposed.

Once a desired operating temperature is reached, open loop cooldown 5020 may cease and closed loop cooling operation 5030 may be utilized to maintain the photodetector at the desired operating temperature/temperature range for the remaining duration of desired operation/activity. While the photodetector remains active 5040, the operating temperature of the detector and/or cryostat is checked to ensure that a desired operating temperature or temperature range is maintained. Although indicated as closed loop operation 5030, such temperature maintenance operation 5030 may also be realized with a low-flow, open-loop cooling circuit of the type described above in FIGS. 1c and 1d.

In some variations, should the operating temperature rise too far above a desired level, the fast cooldown 5020 operation may be re-initiated to quickly bring the operating temperature of the detector back to a desired range/level. In further variations, the fast cooldown operation 5020 may be engaged and disengaged independently from the temperature maintenance operation 5030, allowing the fast cooldown 5020 operation to act as a supplement to the temperature maintenance operation 5030 if necessary.

In some further variations, the temperature maintenance operation 5030 may be suspended or disengaged 5050 when the photodetector is de-activated or otherwise indicated to stop imaging. In further variations, excessive cooling of the photodetector may also be undesirable. In such variations, if the operating temperature drops below a certain level or range during operation, the temperature maintenance operation 5030 may be scaled back, suspended, or ceased altogether 5050 to prevent cooling the photodetector to an undesirable level. In some such variations, suspension of cooling during temperature maintenance operation may 5030 be done to reduce power consumption and/or to conserve refrigerant.

The techniques and solutions discussed herein being thus described, it will be obvious that the same may be varied in many ways. Such variations are not to be regarded as departure from the spirit and scope of the techniques and solutions discussed herein, and all such modifications as would be obvious to one skilled in the art are intended to be included within the scope of the following claims.

What is claimed is:

1. An integrated detector cooler assembly (IDCA) comprising:
    a planar, circular disk-shaped Joule-Thomson cryostat in direct contact with a focal plane array (HA), the cryostat comprising:
        a disk center portion in a middle of the cryostat, the disk center portion having a first center half and a second center half;
        a first disk half portion including the first center half;
        a second disk half portion including the second center half;
        a first cooling circuit disposed on the first disk half portion and comprising a first gas expander portion in the first center half; and
        a second cooling circuit disposed on the second disk half portion and comprising a second gas expander portion in the second center half; and
    a first refrigerant source having a mixed-gas refrigerant to be provided to at least one of said cooling circuits;
    wherein at least one of the first and second cooling circuits is configured to operate as a reverse-flow heat exchanger, such that entering refrigerant is cooled by exiting refrigerant;
    wherein at least one cooling circuit includes heat-transfer bridges disposed on the cryostat along said cooling circuit to transfer heat between high-pressure and low-pressure portions of the cooling circuit, where the high-pressure portion of the cooling circuit is associated with refrigerant flowing into the circuit and the low-pressure portion of the cooling circuit is associated with refrigerant flowing out of the circuit; and
wherein the first and second cooling circuits are both equipped with said heat transfer bridges, and the first and second gas expander portions being coldest portions of the cryostat and in direct thermal contact with the FPA a control portion configured to operate the first cooling circuit in a first mode and operate the second cooling circuit in a second mode.

2. The IDCA of claim 1, the IDCA further comprising a compressor; and
where the first refrigerant source provides refrigerant to the first cooling circuit, said first cooling circuit being configured for open-loop operation; and
where the compressor provides refrigerant to the second cooling circuit, said second cooling circuit being configured for closed-loop operation.

3. The IDCA of claim 1, the IDCA further comprising a second refrigerant source; and
wherein the first refrigerant source provides refrigerant to the first cooling circuit, said first cooling circuit being configured for open-loop operation; and
wherein the second refrigerant source provides refrigerant to the second cooling circuit, said second cooling circuit being configured for open-loop operation.

4. The IDCA of claim 1, the IDCA further comprising a control portion; and
wherein the control portion controls operation of the first and second circuits by activating the first circuit to bring the FPA disposed on the cryostat to a desired operating temperature and by activating the second circuit to maintain the FPA at the desired operating temperature.

5. The IDCA of claim 1, the IDCA further comprising a switching portion that controls a flow of refrigerant from the first refrigerant source to at least one of the cooling circuits.

6. The IDCA of claim 1, the IDCA further comprising:
a first switching portion that controls a flow of refrigerant from the first refrigerant source to the first cooling circuit; and
a second switching portion that controls a flow of refrigerant to the second cooling circuit.

7. The IDCA of claim 1, wherein the first and second cooling circuits are both equipped with said heat transfer bridges.

8. The IDCA of claim 1, wherein the mixed-gas refrigerant includes one or more of ethane, methane, or isobutane.

9. The IDCA of claim 1, wherein the first refrigerant source supplies the refrigerant used to operate the second cooling circuit.

10. The IDCA of claim 9, wherein the refrigerant used to operate the second cooling circuit is recovered from a refrigerant exhaust of the first cooling circuit.

11. The IDCA of claim 1, wherein:
the first center half includes baffles to take high-pressure refrigerant for expansion; and
the second center half includes baffles to take high-pressure refrigerant for expansion, wherein the expansion to cause a local low-pressure area at the center portion.

12. The IDCA of claim 1, wherein the first cooling mode is a high-flow, rapid cooling mode and the second cooling mode is a low-flow, temperature maintenance mode.

13. A cryostat, the cryostat comprising:
planar disk-shaped structure including a center portion having a first center half and a second center half in a middle of the structure; a first half-circular portion including the first center half; and a second half-circular portion including the second center half;
a first Joule-Thomson (JT) cooling circuit disposed on the first half-circular portion and comprising a first gas expander portion in the first center half;
a second JT cooling circuit disposed on the second half-circular portion and comprising a second gas expander portion in the second center half;
a mixed-gas refrigerant flowing in said first and second cooling circuits;
the first and second JT cooling circuits configured to operate as reverse-flow heat exchangers such that the refrigerant entering the cooling circuits via a refrigerant inlet port is cooled by refrigerant leaving the circuits via a refrigerant outlet port;
heat transfer bridges disposed on said cryostat along at least one of said first and second JT cooling circuits, said heat transfer bridges being configured to enhance the reverse-flow heat exchange operation of the at least one of said first and second cooling circuits; and
the first and second gas expander portions being coldest portions of the cryostat and in direct thermal contact with a photodetector a control portion configured to operate the first JT cooling circuit in a first mode and operate the second cooling JT circuit in a second mode.

14. The cryostat of claim 13, wherein the photodetector is a high operating temperature (HOT) infra-red (IR) photodetector disposed on the cryostat.

15. The cryostat of claim 13, wherein the heat transfer bridges have a coefficient of thermal expansion (CTE) that matches the CTE of the cryostat.

16. The cryostat of claim 13, wherein the cryostat is formed from two glass plates, an upper plate and a lower plate, wherein the first and second JT cooling circuits are etched into the lower plate, wherein the upper plate includes heat transfer bridge pockets to accommodate said heat transfer bridges therein, and wherein the upper and lower plates are bonded together to form the cryostat.

17. The cryostat of claim 13, wherein:
the first center half includes baffles to take high-pressure refrigerant for expansion; and
the second center half includes baffles to take high-pressure refrigerant for expansion, wherein the expansion to cause a local low-pressure area at the center portion wherein the first half-circular portion is separate from the second half-circular portion and side-by-side.

18. The cryostat of claim 13, wherein the first cooling mode is a high-flow, rapid cooling mode and the second cooling mode is a low-flow, temperature maintenance mode.

19. A method of cooling a focal plane array (FPA) disposed in an integrated detector cooler assembly (IDCA) to an operating temperature, the method comprising:
providing a Joule-Thomson (JT) cryostat in the IDCA, the JT cryostat having a planar disk-shaped structure including a center portion having a first center half and a second center half in a middle of the structure; a first half-circular portion; and a second half-circular portion wherein the first half-circular portion includes the first center half and the second half-circular portion includes the second center half; a first cooling circuit disposed on the first half-circular portion and comprising a first gas expander portion in the first center half; a second cooling circuit disposed on the second half-circular portion and comprising a second gas expander portion in the second center half where the first and second cooling circuits configured to operate as reverse-flow heat exchangers such that refrigerant entering the cooling circuits via a refrigerant inlet port is cooled by refrigerant leaving the circuits via a refrigerant outlet port; heat transfer bridges disposed on the said cryostat along at least one of said first and second cooling circuits, said heat transfer bridges being configured to enhance the reverse-flow heat exchange operation of the at least one of said first and second cooling circuits; and where the first and second gas expander portions being coldest portions of the cryostat and in direct thermal contact with the FPA;

executing a rapid cooldown process to bring the FPA down to a desired operating temperature; and executing a temperature maintenance process to maintain the FPA at the desired operating temperature via the second cooling circuit in a low-flow, temperature maintenance mode via a pressurized gas refrigerant wherein the IDCA does not include a coldfinger.

20. The method of claim 19, where the second cooling circuit is a low-flow closed loop cooling circuit and where the pressurized gas refrigerant provided to the low-flow cooling circuit is provided by a compressor included in the IDCA.

21. The method of claim 19, the method further comprising receiving an activation signal directing the FPA to begin imaging and determining whether the FPA is at a desired operating temperature; and where said determining is performed in response to receiving said activation signal.

22. The method of claim 19, wherein:

the first center half includes first baffles to take high-pressure refrigerant; and the second center half includes second baffles to take high-pressure refrigerant, and further comprising generating expansion in the first and second baffles to cause a local low-pressure area at the center portion.

* * * * *

UNITED STATES PATENT AND TRADEMARK OFFICE
CERTIFICATE OF CORRECTION

PATENT NO.        : 9,328,943 B2
APPLICATION NO.   : 13/822522
DATED             : May 3, 2016
INVENTOR(S)       : Vincent Loung et al.

Page 1 of 1

It is certified that error appears in the above-identified patent and that said Letters Patent is hereby corrected as shown below:

In the claims,

Column 16, claim 1, line 45, delete "(HA)" insert --(FPA)--.

Signed and Sealed this
Nineteenth Day of July, 2016

Michelle K. Lee
*Director of the United States Patent and Trademark Office*